United States Patent
Yan (10) Patent No.: US 9,619,206 B2
(45) Date of Patent: Apr. 11, 2017

(54) PSEUDO-RANDOM BIT SEQUENCE GENERATOR

(71) Applicant: Altera Canada Co., Halifax (CA)

(72) Inventor: Junjie Yan, St. John's (CA)

(73) Assignee: Altera Corporation, San Jose, CA (US)

( * ) Notice: Subject to any disclaimer, the term of this patent is extended or adjusted under 35 U.S.C. 154(b) by 220 days.

(21) Appl. No.: 14/259,824

(22) Filed: Apr. 23, 2014

(65) Prior Publication Data

US 2014/0237013 A1 Aug. 21, 2014

Related U.S. Application Data

(63) Continuation of application No. 12/458,122, filed on Jul. 1, 2009, now Pat. No. 8,745,113.

(30) Foreign Application Priority Data

May 7, 2009 (CA) .................................. 2664620

(51) Int. Cl.
*G06F 7/58* (2006.01)
*H03K 3/84* (2006.01)

(52) U.S. Cl.
CPC .............. *G06F 7/582* (2013.01); *G06F 7/584* (2013.01); *H03K 3/84* (2013.01); *G06F 2207/581* (2013.01)

(58) Field of Classification Search
CPC .................................. G06F 7/582; G06F 7/584
See application file for complete search history.

(56) References Cited

U.S. PATENT DOCUMENTS

| | | | |
|---|---|---|---|
| 3,946,215 A | | 3/1976 | May |
| 4,649,419 A | | 3/1987 | Arragon et al. |
| 4,713,605 A | | 12/1987 | Iyer et al. |
| 4,905,176 A | | 2/1990 | Schulz |
| 4,910,735 A | | 3/1990 | Yamashita |
| 4,928,310 A | * | 5/1990 | Goutzoulis ............... H03K 3/84 331/78 |
| 5,412,665 A | | 5/1995 | Gruodis et al. |
| 5,574,673 A | * | 11/1996 | Lowy ...................... G06F 7/584 708/250 |
| 5,787,094 A | | 7/1998 | Cecchi et al. |
| 5,991,909 A | * | 11/1999 | Rajski .............. G01R 31/31813 714/729 |
| 6,148,053 A | * | 11/2000 | Ozluturk .................. H03K 3/84 375/377 |
| 6,188,714 B1 | | 2/2001 | Yamaguchi |
| 6,240,432 B1 | | 5/2001 | Chuang et al. |
| 7,194,496 B2 | | 3/2007 | Morris |
| 7,340,496 B2 | | 3/2008 | Burdine et al. |
| 7,421,637 B1 | | 9/2008 | Martinez, Jr. et al. |

(Continued)

*Primary Examiner* — Andrew Caldwell
*Assistant Examiner* — Calvin M Brien
(74) *Attorney, Agent, or Firm* — Fletcher Yoder, P.C.

(57) ABSTRACT

The present invention discloses a pseudo-random bit sequence (PRBS) generator which outputs the entire datapath, or entire pseudo-random bit sequence, over one single clock cycle. This is accomplished by removing redundancy, or any redundant exclusive-or gates from linear feedback shift registers; using logic to identify the critical path and optimal shift for the critical path; and dividing the datapath into several pipeline stages to increase the clock rate (i.e., transmission speed).

17 Claims, 5 Drawing Sheets

(56) References Cited

U.S. PATENT DOCUMENTS

| | | |
|---|---|---|
| 2002/0013797 A1 | 1/2002 | Jha et al. |
| 2004/0049525 A1 | 3/2004 | Hars |
| 2004/0220985 A1* | 11/2004 | Morris .................. G06F 7/584 |
| | | 708/250 |
| 2007/0273408 A1* | 11/2007 | Golic ..................... G06F 7/584 |
| | | 326/93 |

* cited by examiner

| | | | | |
|---|---|---|---|---|
| 3— | $(x^2 \oplus x^3)$ $\oplus (x^3 \oplus x^4)$ | $x^1 \oplus$ $(x^3 \oplus x^4)$ | $(x^1 \oplus x^2)$ | $(x^2 \oplus x^3)$ | 3e |
| | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | $(x^1 \oplus x^2)$ | 3f |
| | ~~$x^1 \oplus$~~ $(x^3 \oplus x^4)$ ~~$\oplus (x^1 \oplus x^2)$~~ | $(x^1 \oplus x^2)$ $\oplus (x^2 \oplus x^3)$ | $(x^2 \oplus x^3)$ $\oplus (x^3 \oplus x^4)$ | $x^1 \oplus$ $(x^3 \oplus x^4)$ | 3g |

LEGEND
$\oplus$ = XOR

PSEUDO-RANDOM BIT SEQUENCE GENERATOR

CROSS-REFERENCE TO RELATED APPLICATIONS

This is a continuation of U.S. patent application Ser. No. 12/458,122, filed Jul. 1, 2009 (now U.S. Pat. No. 8,745,113), which claims the benefit under 35 U.S.C. §119(b) of Canadian Application No. 2,664,620, filed May 7, 2009, each of which is hereby incorporated by reference in its respective entirety.

STATEMENT REGARDING FEDERALLY SPONSORED RESEARCH OR DEVELOPMENT

N/A

REFERENCE TO A SEQUENCE LISTING, A TABLE, OR A COMPUTER PROGRAM LISTING COMPACT DISC APPENDIX

N/A

BACKGROUND OF THE INVENTION

1. Technical Field of the Invention

The present invention relates to the generation of Pseudo-Random Bit Sequences (PRBS).

2. Background of the Invention

The present invention discloses a method of generating a Pseudo-Random Bit Sequence (PRBS). The utility of such random numbers includes the creation of cryptography keys, the generation of bit stream ciphers and hash functions, and the testing of circuits and circuit simulations to detect and correct design errors.

Figure 1:
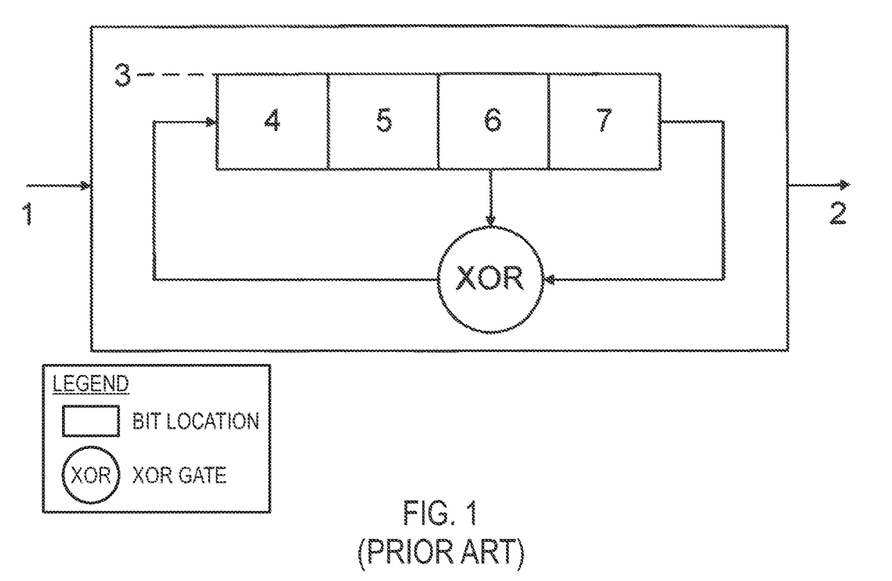
FIG. 1 is a block diagram illustrating a prior art example of a four-bit Linear Feedback Shift Register (LFSR).

A PRBS Generator is typically based on a Linear Feedback Shift Register (LFSR). An LFSR consists of a series of flip-flops connected by Exclusive-Or (XOR) gates, allowing for the output of one or more flip-flops to be input into a subsequent flip-flop. The PRBS Generator will cycle one bit location, or stage, to be output from the LFSR over each clock cycle or period, until each of bit locations 1 to n (where n=datapath width) is output and fed back into the first bit location. Because LFSRs vary in size (4-bits, 16-bits, 64-bits, etc), they will repeat themselves once each bit location or stage is fed back and input into the first bit location. FIG. 1 illustrates a prior art example, where a four-bit LFSR (3) receives input data (1) and cyclically shifts the data by outputting the information from the third bit location (6) and fourth bit location (7), XORing the data together, and creating a new state to be fed back into the first bit location (4). Therefore, in a four-bit LFSR, for each bit to be output from each bit location requires 4 clock periods, where one bit is output each cycle. The input bit is therefore a result of a linear function of the present state LFSR (the XORing of bits from the LFSR), with next state data shifting cyclically through the circuit through a feedback loop to generate a pseudo-random output (2). The LFSR generates a PRBS pattern, which may appear to be truly random but is actually pseudo random due to the deterministic nature of computer-based operations: each of the values produced by the LFSR are determined by the present and next states and because the LFSR is deterministic, the present state can be used to predict the next state.

Figure 2:
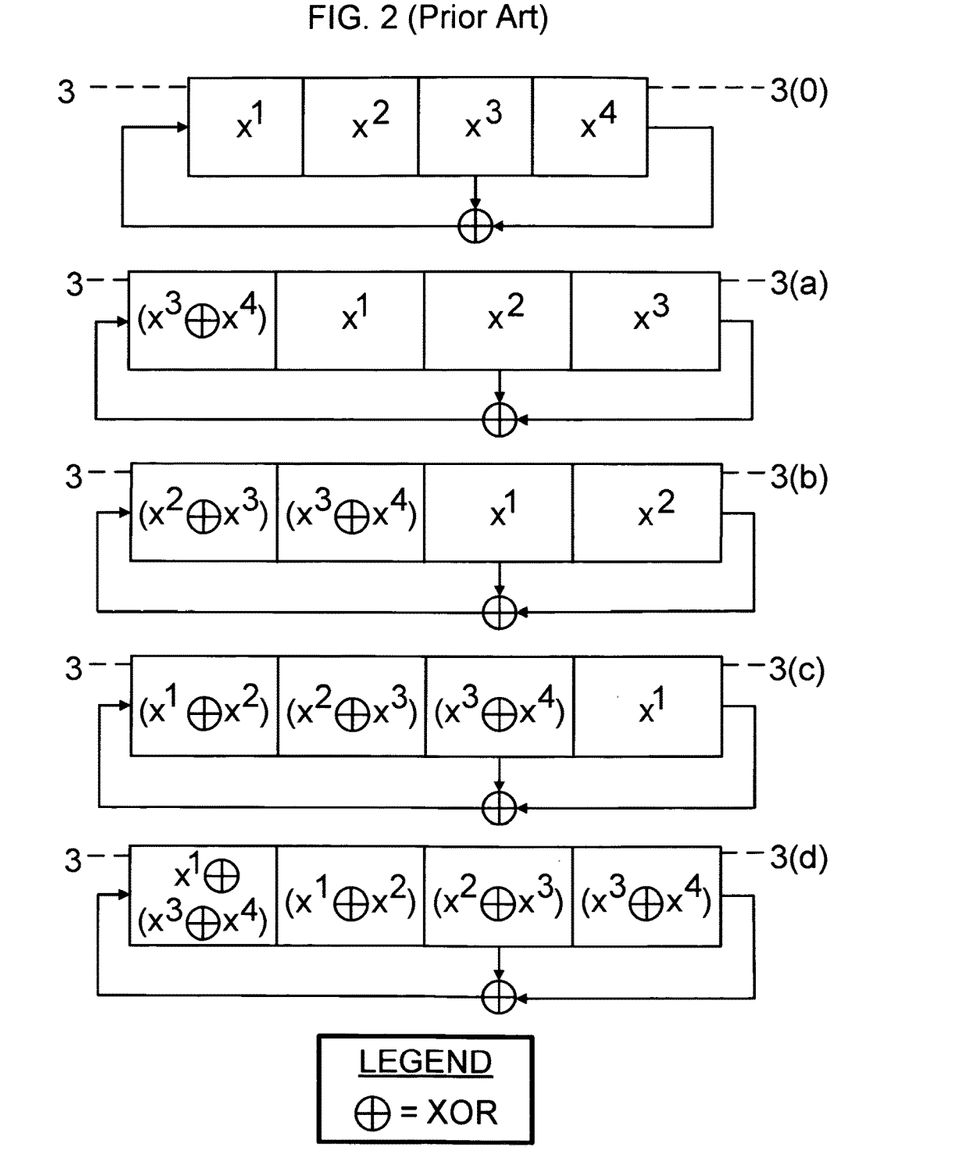
FIG. 2 is a block diagram illustrating a prior art example of a four-bit Linear Feedback Shift Register (LFSR).

A four-bit, PRBS Generating LFSR can be represented by the polynomial 1+x3+x4, where each clock cycle or period outputs one bit, and the four bit locations (or taps) of the LFSR are x1, x2, x3 and x4. In the first clock cycle, the latter two bit locations of the present state, x3 and x4, are XORed together and fed back into the first bit location, x1, so the new value (x3 XOR x4) is located in the first bit location and the x1 value is shifted into the second bit location (formerly x2). As illustrated in FIG. 2, as the circuit continues to XOR the last two bit locations and shift the new values back, the following feedbacks to the first bit location or stage occur:

Feedback [1]=x3 XOR x4
Feedback [2]=x2 XOR x3
Feedback [3]=x1 XOR x2
Feedback [4]=x1 XOR (x3 XOR x4)

After four full clock cycles, the value of the first bit location is (x1 XOR (x3 XOR x4)); the second bit location is (x1 XOR x2); the third bit location is (x2 XOR x3); and the fourth bit location is (x3 XOR x4). The LFSR then repeats itself and continues to shift data through the circuit to generate a PRBS pattern.

Several problems exist with this method of using LFSRs to generate PRBS patterns. First, there is a large amount of latency produced where the LFSR can only output one bit per clock cycle: to output 4 bits from a 4 bit LFSR requires 4 clock cycles; to output 16 bits from a 16 bit LFSR requires 16 clock cycles; etc. The speed of the output also depends on the number of XOR gates the data must travel through; the larger the size of the LFSR, the larger the size of the logic element required to accommodate it, and the larger the number of XOR gates needed.

SUMMARY OF THE INVENTION

When producing a Pseudo-Random Bit Sequence (PRBS) with a Linear Feedback Shift Register (LFSR), latency may be reduced by outputting the entire datapath over one single clock cycle. Typically, an n-bit LFSR has n data bits in bit locations 1–n and 1 bit is output from the datapath each clock cycle. Therefore, after n clock cycles or periods, an n-bit PRBS pattern has been output. However, the present invention discloses a method to reduce the latency of PRBS Generation by (1) removing redundancy, or redundant XOR gates; (2) employing foresee logic to identify the critical path and optimal shift for the critical path; and (3) dividing the datapath into several pipeline stages to increase the clock rate, thereby outputting the entire datapath in one clock cycle.

DETAILED DESCRIPTION OF THE INVENTION

The present invention aims to reduce the latency associated with Pseudo-Random Bit Sequence (PRBS) Generation by outputting an entire datapath in one clock cycle or period, as opposed to the prior art practice of outputting one single bit in one clock cycle or period. This would imply that for an n-bit LFSR, the datapath would shift n times each clock cycle to output the entire n-bit datapath. However, the present invention employs a combinational logic element to foresee the next state, eliminating any wait time associated with the n-bit datapath shift.

Figure 4:
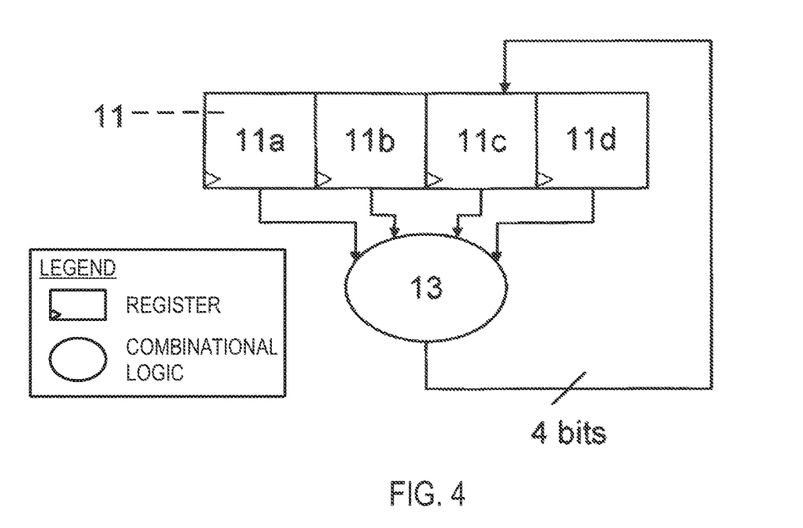
FIG. 4 is a block diagram illustrating a simplified view of an illustrative embodiment of the present invention.

As illustrated in FIG. 4, a present state value exists in a Linear Feedback Shift Register (11). It should be noted that the 4-bit LFSR (11) is illustrated for demonstrative purposes only and should not be considered to limit the scope of the invention, as the invention may be applicable to any size LFSR. The LFSR (11), instead of XORing data from the final two bit locations (11c, 11d) and feeding back the new value to the first bit location (11a), as shown in the prior art example of FIG. 1, instead transmits the data from LFSR (11) into a combinational logic (13), which determines the next state, or the next bit shift, without LFSR (11) actually shifting the data. Note that this combinational logic (13) has no register and therefore is not controlled by a clock. The next state as determined by combinational logic (13) is then fed back to LFSR (11) as the new present state. The ability of the combinational logic (13) to foresee or calculate the next state and feed the value back to the original LFSR (11) as the new present state eliminates the need to output all n-bits from the datapath by shifting all n-bits in the LFSR (11), which is critical in reducing the PRBS Generation latency.

In addition to providing the ability to foresee the next state, the combinational logic element also provides the ability to identify the critical path. It should be noted that the term "critical path" typically refers to the longest path for the data to travel between registers, based upon the number of XOR gates and the length of the datapath route. However, for illustrative purposes, the present invention employs the term "critical path" to refer to the maximum number of XOR gates between registers, and does not refer to the length of the datapath route. The critical path is important as it acts as the signal which determines the overall frequency of the PRBS Generator. The speed of the PRBS Generator depends on the number of XOR gates the critical path must travel through, so to minimize latency you must minimize the number of XOR gates. In an n-bit LFSR, n is the size of the datapath and therefore n-bit shifts results in the highest amount of XOR gates. The latency of the PRBS Generator can be reduced by removing redundancy (i.e., removing all even-numbered XOR gates and removing all but one odd-numbered XOR gates) and therefore determining the smallest bit-shift for the critical path.

Figure 3:
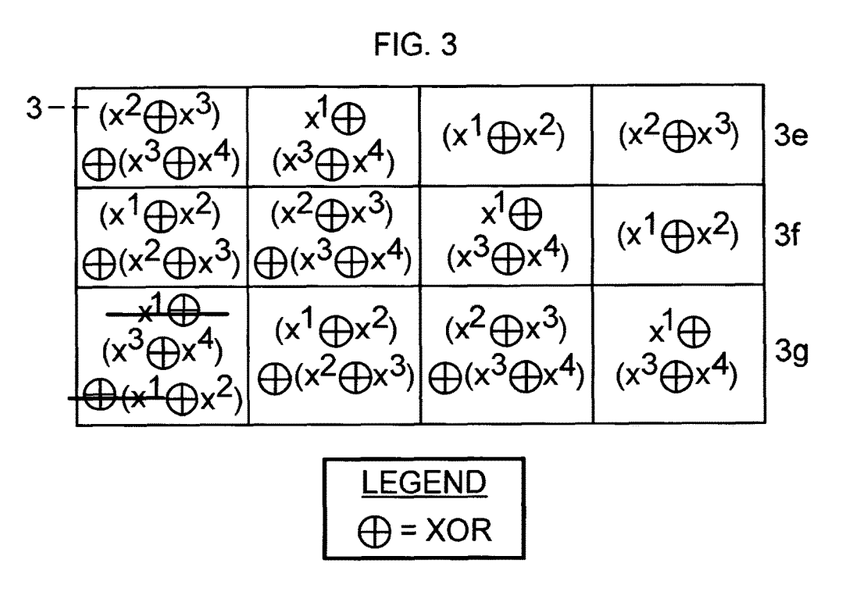
FIG. 3 is a block diagram illustrating the present invention's improvement upon the LFSR (3) of FIG. 2.

FIG. 3 is provided as an illustrative example of the removal of redundancy within the prior art 4-bit LFSR (3) illustrated in FIG. 2. As illustrated in FIG. 3, when 4 bit locations, x1, x2, x3 and x4 are repeatedly shifted, the maximum number of XOR gates is 3, as found in the first bit location of the fifth bit shift (3e). After the seventh shift (3g) we see a total of 4 XOR gates in the first bit location, but the redundant even-numbered values cancel each other out to leave only 2 XOR gates remaining in the first bit location. Therefore, the smallest and most efficient shift for the critical path is 3. This number is identified through the use of software or another hardware platform which removes redundancy by removing all even-numbered XOR gates and removing all but one odd-numbered XOR gates, and subsequently identifies the critical path, as, again, the maximum number of XOR gates between registers. The software (or other hardware platform) then iterates through all possible bit shifts to determine the optimal bit-shift for the critical path.

Figure 5:
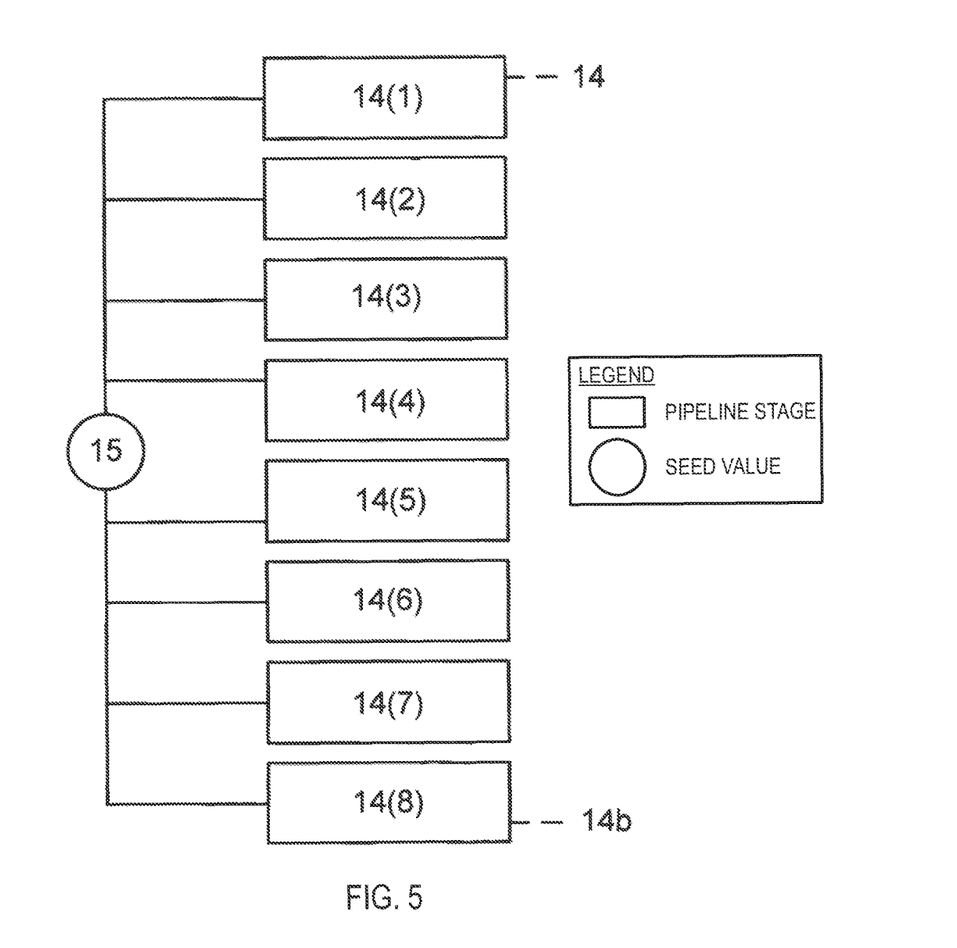
FIG. 5 is a block diagram illustrating a simplified view of an illustrative embodiment of the present invention.

The size of the combinational logic (13) used to determine the next state is directly correlated to the size of the LFSR and therefore the size of the datapath. For example, a 4-bit LFSR will necessitate a 4-bit combinational logic element, a 16-bit LFSR will necessitate a 16-bit combinational logic element; a 64-bit LFSR will necessitate a 64-bit combinational logic element, etc. Therefore, both the combinational logic and the critical path may be too large. To reduce the size and latency of the PRBS Generator, the datapath may be reduced by splitting it into several pieces, or pipeline stages. The pipeline consists of multiple blocks connected as a series, where the data output from one pipeline stage is input into a next pipeline stage. As illustrated in FIG. 5, the datapath is broken into a number of pipeline stages, 1–b, where b=total number of pipeline stages, (14(1)-14(8)), and the registers within each stage are initialized by a seed (m) value, where m≠0 (15), which indicates to each LFSR the number of bits to shift out for each clock cycle or period. When two or more LFSRs are arranged in pipeline stages (b), and each clock cycle or period outputs a number of bits from each pipeline stage (b) which are then concatenated as the total output, the latency of the PRBS Generator is reduced.

DETAILED DESCRIPTION OF AN ILLUSTRATIVE EMBODIMENT OF THE INVENTION

In an illustrative embodiment of the present invention, PRBS Generation occurs over a 256-bit OTU3 datapath, where software or another hardware platform is used to remove redundancy by removing all even-numbered XOR gates and removing all but one odd-numbered XOR gates, subsequently identifying the critical path, and the software (or other hardware platform) then iterates through all possible bit-shifts to identify the optimal shift for the critical path. For a 256-bit OTU3 datapath, the critical path is 32 bits (as described above). A 256 bit datapath with a 32 bit critical path requires 8 pipeline stages (256÷32=8).

In the illustrative embodiment of the present invention, PRBS Generation consists of two phases; the "initialization phase" and the "normal phase." As illustrated in FIG. 5, "initialization phase" occurs when a seed (m) value (15), is issued to initialize the PRBS generator by signaling the data shift in each of the b pipeline stages (14(1)-14(8)). The contents of each pipeline stage are expanded in FIG. 6, where block (14(1)) and block (14(2)) each represent a pipeline stage (b).

Figure 6:
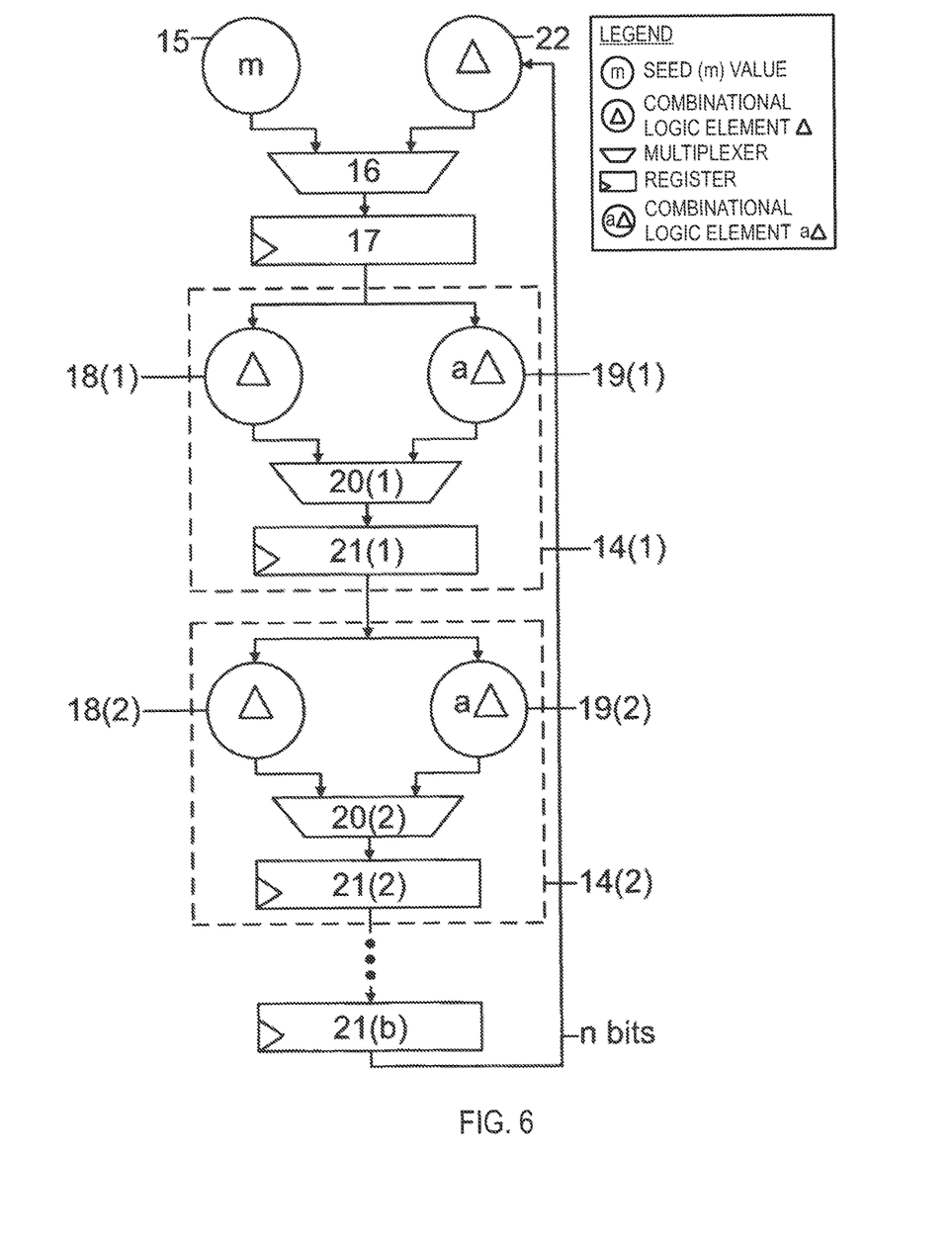
FIG. 6 is a block diagram illustrating an illustrative embodiment of the invention.

As shown in FIG. 6, in initialization phase, the seed (m) value (15) is input into multiplexer (16) and into a first register (17) which outputs the value into a first pipeline stage (14(1)). In the first pipeline stage (14(1)), multiplexer (20(1)) selects the initialization input from combinational logic element Δ (18(1)) and loads this value into the first pipeline stage register (21(1)). The value of combinational logic element Δ (18(1)), specified by seed (m), indicates the amount of data needed to shift per pipeline stage. From register (21(1)) the data is fed into the next pipeline stage (14(2)) where the data in register (21(2)) is similarly shifted. This process is repeated until the value reaches the final register (21(b)), whereby the value, or the next state, is fed back to the first register (17) as the new present state.

Once the new present state is fed back to the first register (17) via combinational logic element Δ (22) and multiplexer (16), the PRBS Generation has entered "normal phase." In the first pipeline stage (14(1)), multiplexer (20(1)) now selects the normal phase input from combinational logic element aΔ (19(1)) and loads this value into the first pipeline stage register (21(1)) (as opposed to multiplexer (20(1)) selecting the initialization input from combinational logic element Δ (18(1)) as in the "initialization phase"). The value of combinational logic element aΔ (19(1)), specifies the new amount of data needed to shift per pipeline stage. As in initialization phase, from register (21(1)) the data is fed into the next pipeline stage (14(2)) where the data in register (21(2)) is similarly shifted. The process is repeated until the value reaches the final register (21(b)), and the value, or the next state, is again fed back to the first register (17) as the new present state. This process is repeated in "normal phase" for a total of b clock cycles or periods, as the number of clock cycles or periods needed to output the full datapath is equivalent to the number of pipeline stages (b).

In this illustrative embodiment of the present invention, each pipeline stage (b) register (21(1-b)) represents the logic shifted by the previous stages, so the first register (21(1)) outputs data into a second register (21(2)) and shifts the data in the second register (21(2)) by 32 bits; the second register (21(2)) outputs data into a third register (21(3)) (not shown) and shifts the data in the third register (21(3)) by 32 bits; this continues until the second-to-last register (21(b-1)) outputs data into a final register (21(b)) and shifts the data in the final register (21(b)) by 32 bits. In the illustrative embodiment of the present invention, the data shift output over each clock cycle equals 32 bits per pipeline stage, with 8 pipeline stages, which when concatenated produces the first full 256-bit datapath. In "normal phase," PRBS Generation works continuously, producing PRBS patterns each clock cycle; there is no wait time associated as in the "initialization phase."

In the illustrative embodiment of the invention, the PRBS Generator is comprised of two main types of combinational logic elements, Δ and aΔ, which determine the critical path. Where the datapath is n=256 bits, software or another hardware platform can be used to calculate the longest path and the number of XOR gates for each signal by allowing a=1, a=2, a=3, etc., until a=128, or ½ n as the last divider. The flexibility of up to 128 options allows for the most optimal path to be chosen.

A number of equations to identify the critical path can be determined. Where, $n$=datapath $b$=number of pipeline stages $\Delta$=shift×bits combinational logic $a\Delta$=shift($a$*$x$) bits combinational logic And the critical path is the path of Δ if it is longer than the path of aΔ, or the critical path is the path of aΔ if it is longer than the path of Δ, i.e., critical path=max($\Delta,a\Delta$)

Then:

$n=(x*b)$

OR $a=(n\div b)+1$

In normal mode, x bits are output from each register at every clock cycle: the concatenation of these bits generates the n-bit PRBS pattern.

I claim:
1. Bit sequence generation circuitry comprising:
first register circuitry that stores a current state data; and
first combinational logic circuitry that:
receives the current state data from the first register circuitry;
determines a next state data in a single clock cycle by processing the current state data through the first combinational logic circuitry, wherein the next state data is equivalent to an n-bit datapath that would be generated by a linear feedback shift register as a result of n bit-shifts through the linear feedback shift register; and
outputs the next state data;
wherein a critical path of the first combinational logic circuitry comprises a maximum number of logic gates for data to travel through to process from the current state data to the next state data, wherein the maximum number of logic gates is fewer than a number of logic gates that would be applied by the linear feedback shift register over the n bit-shifts through the linear feedback shift register.

2. The bit sequence generation circuitry of claim 1, wherein the first combinational logic circuitry does not include logic gates that would be redundant.

3. The bit sequence generation circuitry of claim 1, wherein the first register circuitry outputs a plurality of pseudo-random bits.

4. The bit sequence generation circuitry of claim 3, wherein the first register circuitry outputs the plurality of pseudo-random bits in the single clock cycle.

5. The bit sequence generation circuitry of claim 1, wherein the logic gates comprise XOR gates.

6. The bit sequence generation circuitry of claim 1, wherein the first register circuitry receives the next state data from the first combinational logic circuitry and replaces the stored current state data with the received next state data.

7. Bit sequence generation circuitry comprising:
first combinational logic circuitry that:
receives a current state data stored in first register circuitry;
determines a next state data in a single clock cycle by processing the current state data through the first combinational logic circuitry, wherein the next state data is equivalent to an n-bit datapath that would be generated by a linear feedback shift register as a result of n bit-shifts through the linear feedback shift register; and
outputs the next state data; and
the first register circuitry that:
receives the next state data from the first combinational logic circuitry; and
replaces the stored current state data with the received next state data;
wherein a critical path of the first combinational logic circuitry comprises a maximum number of logic gates for data to travel through to process from the current state data to the next state data, wherein the maximum number of logic gates is fewer than a number of logic gates that would be applied by the linear feedback shift register over the n bit-shifts through the linear feedback shift register.

8. The bit sequence generation circuitry of claim 7, wherein the first combinational logic circuitry does not include logic gates that would be redundant.

9. The bit sequence generation circuitry of claim 7, wherein logic gates that would be redundant were removed by a hardware platform or a software platform.

10. The bit sequence generation circuitry of claim 7, wherein the first register circuitry outputs a plurality of pseudo-random bits.

11. The bit sequence generation circuitry of claim 10, wherein the first register circuitry outputs the plurality of pseudo-random bits in the single clock cycle.

12. The bit sequence generation circuitry of claim 7, wherein the logic gates comprise XOR gates.

13. The bit sequence generation circuitry of claim 7, wherein the first combinational logic circuitry performs the receiving, determining, and outputting without a clock input.

14. A method for generating a bit sequence comprising:
transmitting current state data stored in first register circuitry to first combinational logic circuitry;
receiving next state data from the first combinational logic circuitry into the first register circuitry, wherein the next state data is determined in a single clock cycle by processing the current state data through the first combinational logic circuitry, wherein the next state data is equivalent to an n-bit datapath that would be generated by a linear feedback shift register as a result of n bit-shifts through the linear feedback shift register, wherein a critical path of the first combinational logic circuitry comprises a maximum number of logic gates for data to travel through to process from the current state data to the next state data, and wherein the maximum number of logic gates is fewer than a number of logic gates that would be applied by the linear feedback shift register over the n-bit shifts through the linear feedback shift register; and
replacing the current state data stored in the first register circuitry with the received next state data.

15. The method of claim 14, wherein the first combinational logic circuitry does not include logic gates that would be redundant.

16. The method of claim 14, comprising outputting, via the first register circuitry, a plurality of pseudo-random bits.

17. The method of claim 16, wherein the plurality of pseudo-random bits are output in a single clock cycle.

* * * * *